United States Patent
Nakamitsu et al.

(10) Patent No.: US 12,538,829 B2
(45) Date of Patent: Jan. 27, 2026

(54) BONDING APPARATUS, BONDING SYSTEM, BONDING METHOD, AND RECORDING MEDIUM

(71) Applicant: Tokyo Electron Limited, Tokyo (JP)

(72) Inventors: Takashi Nakamitsu, Koshi (JP); Shuhei Matsumoto, Koshi (JP); Yosuke Omori, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 627 days.

(21) Appl. No.: 17/936,068

(22) Filed: Sep. 28, 2022

(65) Prior Publication Data

US 2023/0026661 A1 Jan. 26, 2023

Related U.S. Application Data

(63) Continuation of application No. 16/347,868, filed as application No. PCT/JP2017/036782 on Oct. 11, 2017, now Pat. No. 11,488,929.

(30) Foreign Application Priority Data

Nov. 9, 2016 (JP) .................................. 2016-218580

(51) Int. Cl.
*B32B 41/00* (2006.01)
*B23K 20/00* (2006.01)
(Continued)

(52) U.S. Cl.
CPC .............. *H01L 24/78* (2013.01); *B23K 20/00* (2013.01); *H01L 21/02* (2013.01);
(Continued)

(58) Field of Classification Search
CPC ..... H01L 24/78; H01L 21/02; H01L 21/2007; H01L 21/67092; H01L 21/67259;
(Continued)

(56) References Cited

U.S. PATENT DOCUMENTS

2008/0294280 A1  11/2008  Okita
2010/0139836 A1   6/2010  Horikoshi
(Continued)

FOREIGN PATENT DOCUMENTS

JP      2011-066287 A    3/2011
JP      2012-156304 A    8/2012
(Continued)

OTHER PUBLICATIONS

International Search Report for International Application No. PCT/JP2017/036782, dated Dec. 26, 2017.

*Primary Examiner* — Michael N Orlando
*Assistant Examiner* — Joshel Rivera
(74) *Attorney, Agent, or Firm* — Chrisman Gallo Tochtrop LLC

(57) ABSTRACT

A bonding apparatus configured to bond substrates includes a first holder configured to vacuum-exhaust a first substrate to attract and hold the first substrate on a bottom surface thereof; a second holder disposed under the first holder, and configured to vacuum-exhaust a second substrate to attract and hold the second substrate on a top surface thereof; a mover configured to move the first holder and the second holder relatively in a horizontal direction; a laser interferometer system configured to measure a position of the first holder or the second holder which is moved by the mover; a linear scale configured to measure a position of the mover; and a controller configured to control the mover based on a measurement result of the laser interferometer system and a measurement result of the liner scale.

8 Claims, 9 Drawing Sheets

(51) Int. Cl.
 *H01L 21/02* (2006.01)
 *H01L 21/20* (2006.01)
 *H01L 21/67* (2006.01)
 *H01L 21/68* (2006.01)
 *H01L 21/683* (2006.01)
 *H01L 23/00* (2006.01)

(52) U.S. Cl.
 CPC .... *H01L 21/2007* (2013.01); *H01L 21/67092* (2013.01); *H01L 21/67259* (2013.01); *H01L 21/67265* (2013.01); *H01L 21/68* (2013.01); *H01L 21/681* (2013.01); *H01L 21/6838* (2013.01); *H01L 24/85* (2013.01)

(58) Field of Classification Search
 CPC . H01L 21/67265; H01L 21/68; H01L 21/681; H01L 21/6838; H01L 24/85; H01L 21/67121; H01L 21/185; H01L 21/48; H01L 21/50; H01L 21/67011; H01L 21/67703; H01L 22/12; B23K 20/00
 USPC .................... 156/60, 64, 350, 351, 378, 379
 See application file for complete search history.

(56) References Cited

U.S. PATENT DOCUMENTS

| | | |
|---|---|---|
| 2011/0222037 A1 | 9/2011 | Kiuchi et al. |
| 2015/0044786 A1 | 2/2015 | Huang et al. |
| 2016/0023356 A1* | 1/2016 | Hara .................. G03F 7/70716 294/185 |
| 2017/0047225 A1 | 2/2017 | Suga et al. |

FOREIGN PATENT DOCUMENTS

| | | |
|---|---|---|
| JP | 2013-198384 A | 9/2013 |
| JP | 2015-015269 A | 1/2015 |
| JP | 2015-060946 A | 3/2015 |
| JP | 2016-105458 A | 6/2016 |
| KR | 10-2010-0063000 A | 6/2010 |

* cited by examiner

BONDING APPARATUS, BONDING SYSTEM, BONDING METHOD, AND RECORDING MEDIUM

CROSS-REFERENCE TO RELATED APPLICATION

This is a continuation application of U.S. patent application Ser. No. 16/347,868, filed May 7, 2019, which is a U.S. national phase application under 35 U.S.C. § 371 of PCT Application No. PCT/JP2017/036782 filed on Oct. 11, 2017, which claims the benefit of Japanese Patent Application No. 2016-218580 filed on Nov. 9, 2016, the entire disclosures of which are incorporated herein by reference.

TECHNICAL FIELD

The various embodiments described herein pertain generally to a bonding apparatus configured to bond substrates, a bonding system equipped with the bonding apparatus, a bonding method using the bonding apparatus and a recording medium.

BACKGROUND ART

Recently, semiconductor devices are getting miniaturized. If a plurality of highly integrated semiconductor devices is placed on a horizontal plane and these semiconductor devices are connected by a wiring to be produced as a product, a wiring length is increased. As a result, resistance of the wiring is increased, and there is a concern that a wiring delay may be increased.

In this regard, there is proposed using a three-dimensional integration technique of stacking semiconductor devices three-dimensionally. In this three-dimensional integration technique, two sheets of semiconductor wafers (hereinafter, referred to as "wafers") are bonded by using a bonding system described in, for example, Patent Document 1. By way of example, the bonding system is equipped with a surface modifying apparatus configured to modify to-be-bonded surfaces of wafers; a surface hydrophilizing apparatus configured to hydrophilize the surfaces of the wafers which are modified by the surface modifying apparatus; a bonding apparatus configured to bond the wafers having the surfaces which are hydrophilized by the surface hydrophilizing apparatus. In this bonding system, the surfaces of the wafers are modified in the surface modifying apparatus by performing a plasma processing on the surfaces of the wafers. Further, in the surface hydrophilizing apparatus, the surfaces of the wafers are hydrophilized by supplying pure water onto the surfaces thereof. Then, the wafers are bonded in the bonding apparatus by a Van der Waals force and a hydrogen bond (intermolecular force).

In the aforementioned bonding apparatus, one wafer (hereinafter, referred to as "upper wafer") is held by using an upper chuck, and the other wafer (hereinafter, referred to as "lower wafer") is held by a lower chuck provided under the upper chuck. While being held by these upper and lower chucks, the upper wafer and the lower wafer are bonded. Here, before the wafers are bonded, positions of the upper wafer and the lower wafer in a horizontal direction are adjusted by moving the lower chuck in the horizontal direction, and, also, positions of the upper wafer and the lower wafer in a vertical direction are adjusted by moving the lower chuck in the vertical direction.

A mover configured to move the lower chuck in the horizontal direction is moved on a rail which is extended in the horizontal direction (X direction and Y direction). Further, a mover configured to move the lower chuck in the vertical direction includes: a base having a wedge shape (triangular prism shape) with an inclined surface; and a linear guide configured to be movable along a top surface of the base. The linear guide is moved along the base in the horizontal direction and the vertical direction, and, accordingly, the lower chuck supported at the linear guide is moved in the vertical direction.

Patent Document 1: Japanese Patent Laid-open Publication No. 2016-105458.

In the bonding apparatus disclosed in the aforementioned Patent Document 1, when moving the lower chuck in the horizontal direction, a position of the mover in the horizontal direction is measured by using, for example, a linear scale. By feedback-controlling the mover based on the measurement result, the position of the lower chuck in the horizontal direction is adjusted.

Even if, however, the horizontal positions of the upper wafer and the lower wafer are adjusted through the feedback control using the linear scale, the lower chuck may be moved in the horizontal direction as well when it is moved in the vertical direction later as the base of the mover has the wedge shape as stated above. Resultantly, the position of the lower chuck in the horizontal direction may be deviated. Further, since this deviation in the horizontal direction is a deviation of the lower chuck at a load side, this deviation may not be detected with the linear scale which is configured to measure the position of the mover in the horizontal direction. Accordingly, when bonding the wafers, there is a concern that the upper wafer and the lower wafer may be bonded while being deviated from each other. In this regard, there is still a room for improvement in bonding the wafers.

SUMMARY

The purpose of exemplary embodiments described herein is to provide a technique capable of performing a bonding processing of bonding substrates appropriately by performing position adjustment of a first holder configured to hold a first substrate and a second holder configured to hold a second substrate appropriately.

In one exemplary embodiment, a bonding apparatus configured to bond substrates includes a first holder configured to vacuum-exhaust a first substrate to attract and hold the first substrate on a bottom surface thereof; a second holder disposed under the first holder, and configured to vacuum-exhaust a second substrate to attract and hold the second substrate on a top surface thereof; a mover configured to move the first holder and the second holder relatively in a horizontal direction; a laser interferometer system configured to measure a position of the first holder or the second holder which is moved by the mover; a linear scale configured to measure a position of the mover; and a controller configured to control the mover based on a measurement result of the laser interferometer system and a measurement result of the liner scale.

According to the exemplary embodiment, a position of the first holder or the second holder at a load side can be measured by using the laser interferometer system. Further, a position of the mover can be measured by using the linear scale. Accordingly, even if the first holder or the second holder is deviated in the horizontal direction when moving the first holder or the second holder in a vertical direction as in the prior art, a deviation amount in the horizontal direction can be measured by using the laser interferometer system. Therefore, a relative position between the first holder and the second holder can be appropriately adjusted, and, accordingly, the bonding between the first substrate held by the first holder and the second substrate held by the second holder can be appropriately carried out later.

In another exemplary embodiment, a bonding system equipped with a bonding apparatus includes a processing station equipped with the bonding apparatus; and a carry-in/out station configured to place thereon multiple first substrates, multiple second substrates or multiple combined substrates each obtained by bonding the first substrate and the second substrate, and configured to carry the first substrates, the second substrates or the combined substrates into/from the processing station. The processing station comprises a surface modifying apparatus configured to modify surfaces of the first substrate or the second substrate to be bonded; a surface hydrophilizing apparatus configured to hydrophilize the surfaces of the first substrate or the second substrate modified by the surface modifying apparatus; and a transfer device configured to transfer the first substrates, the second substrates or the combined substrates with respect to the surface modifying apparatus, the surface hydrophilizing apparatus and the bonding apparatus. In the bonding apparatus, the first substrate and the second substrate having the surfaces hydrophilized by the surface hydrophilizing apparatus are bonded.

In yet another exemplary embodiment, in a bonding method of bonding substrates by using a bonding apparatus, the bonding apparatus comprises a first holder configured to vacuum-exhaust a first substrate to attract and hold the first substrate on a bottom surface thereof; a second holder disposed under the first holder, and configured to vacuum-exhaust a second substrate to attract and hold the second substrate on a top surface thereof; a mover configured to move the first holder and the second holder relatively in a horizontal direction; a laser interferometer system configured to measure a position of the first holder or the second holder which is moved by the mover; and a linear scale configured to measure a position of the mover. The bonding method comprises controlling the mover using a measurement result of the laser interferometer system and a measurement result of the linear scale to adjust a relative position between the first holder and the second holder.

In still yet another exemplary embodiment, there is provided a computer-readable recording medium having stored thereon computer-executable instructions that, in response to execution, cause the bonding apparatus to perform the bonding method.

According to the exemplary embodiments as described above, it is possible to perform the bonding processing of bonding the substrates appropriately by performing the position adjustment of the first holder configured to hold the first substrate and the second holder configured to hold the second substrate appropriately.

DETAILED DESCRIPTION

Hereinafter, various exemplary embodiments will be described with reference to accompanying drawings. Further, it should be noted that the exemplary embodiments are not intended to be anyway limiting.

1. Configuration of Bonding System

Figure 1:
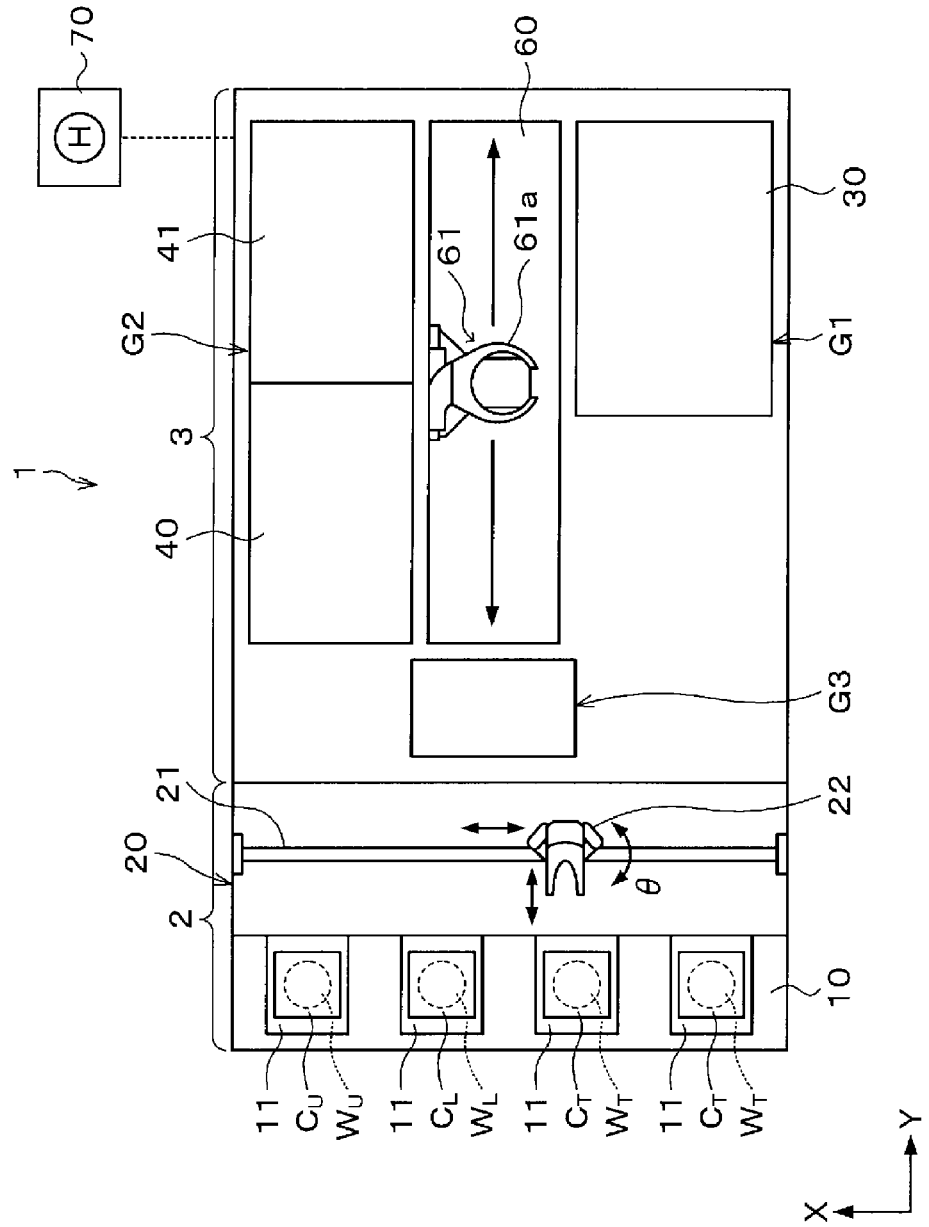
FIG. 1 is a plan view schematically illustrating a configuration of a bonding system according to an exemplary embodiment.
Figure 2:
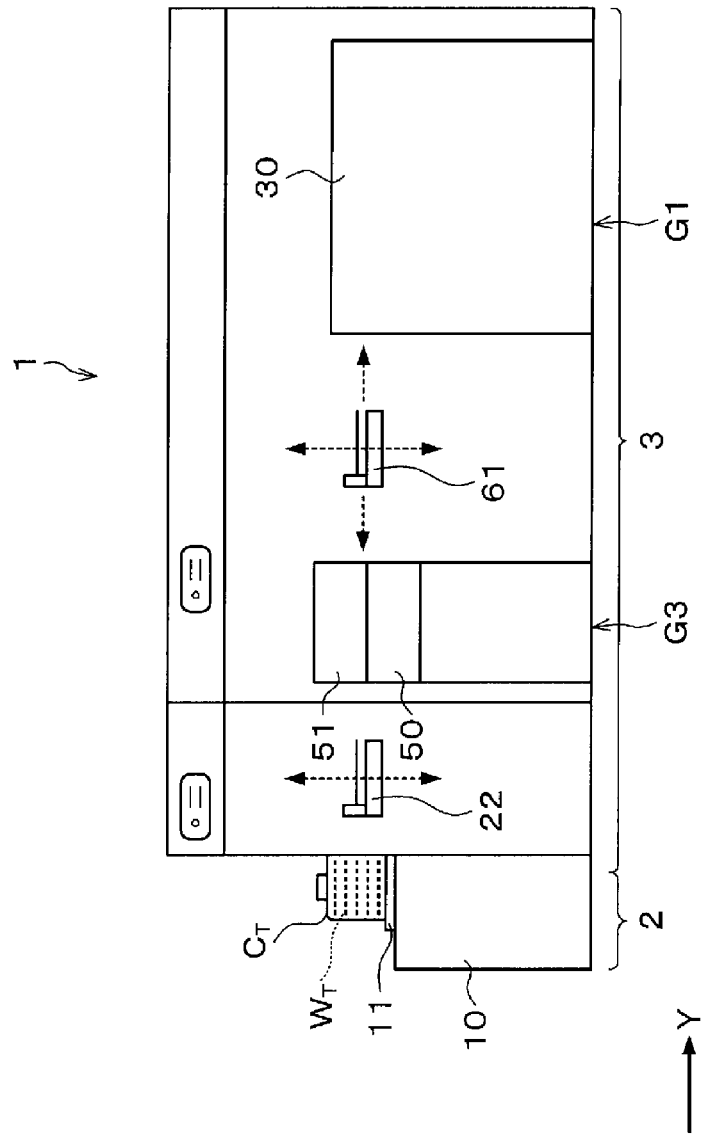
FIG. 2 is a side view schematically illustrating an internal configuration of the bonding system according to the exemplary embodiment.

First, a configuration of a bonding system according to an exemplary embodiment will be discussed. FIG. 1 is a plan view schematically illustrating a configuration of a bonding system 1. FIG. 2 is a side view schematically illustrating an internal configuration of the bonding system 1.

Figure 3:
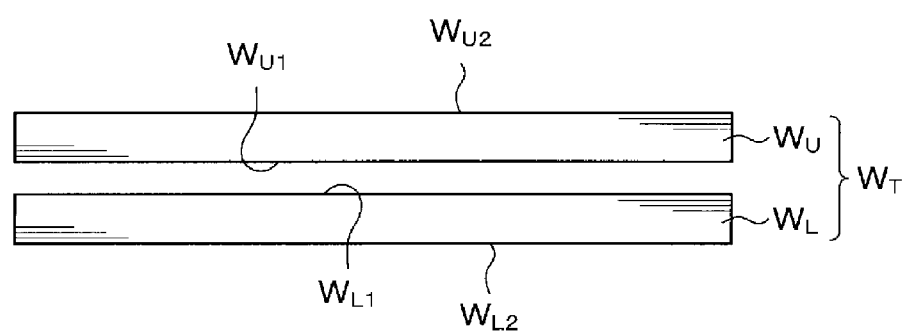
FIG. 3 is a side view schematically illustrating a configuration of an upper wafer and a lower wafer.

In the bonding system 1, two sheets of wafers $W_U$ and $W_L$ as substrates are bonded, for example, as shown in FIG. 3. Hereinafter, a wafer placed at an upper side is referred to as "upper wafer $W_U$" as a first substrate, and a wafer placed at a lower side is referred to as "lower wafer $W_L$" as a second substrate. Further, in surfaces of the upper wafer $W_U$, a bonding surface to be bonded is referred to as "front surface $W_{U1}$," and a surface opposite to the front surface $W_{U1}$ is referred to as "rear surface $W_{U2}$." Likewise, in surfaces of the lower wafer $W_L$, a bonding surface to be bonded is referred to as "front surface $W_{L1}$," and a surface opposite to the front surface $W_{L1}$ is referred to as "rear surface $W_{L2}$." In the bonding system 1, a combined wafer $W_T$ as a combined substrate is formed by bonding the upper wafer $W_U$ and the lower wafer $W_L$.

The bonding system 1 is equipped with, as depicted in FIG. 1, a carry-in/out station 2 and a processing station 3 connected as a single body. The carry-in/out station 2 is configured to carry cassettes $C_U$, $C_L$ and $C_T$, which accommodates therein a plurality of wafers $W_U$, a plurality of wafers $W_L$ and a plurality of combined wafers $W_T$, respectively, to/from the outside. The processing station 3 is equipped with various kinds of processing apparatuses configured to perform preset processings on the wafers $W_U$ and $W_L$ and the combined wafer $W_T$.

The carry-in/out station 2 includes a cassette placing table 10. The cassette placing table 10 is equipped with a multiple number of, for example, four cassette placing plates 11. The cassette placing plates 11 are arranged in a horizontal X direction (up-and-down direction of FIG. 1). When the cassettes $C_U$, $C_L$, $C_T$ are carried to/from the outside of the bonding system 1, the cassettes $C_U$, $C_L$, $C_T$ are placed on these cassette placing plates 11. In this way, the carry-in/out station 2 is configured to be capable of holding a multiple number of upper wafers $W_U$, a multiple number of lower wafers $W_L$ and a multiple number of combined wafers $W_T$. Further, the number of the cassette placing tables 11 is not limited to the example shown in the present exemplary embodiment, and may be set as required. Furthermore, one of the cassettes may be used to collect abnormal wafers. That is, an abnormal combined wafer, which has suffered a problem in bonding between an upper wafer $W_U$ and a lower wafer $W_L$, is separately accommodated in a cassette to be separated from other normal combined wafers $W_T$. In the present exemplary embodiment, one of the cassettes $C_T$ is used for the collection of the abnormal wafers, and other cassettes $C_T$ are used for the accommodation of the normal combined wafers $W_T$.

The carry-in/out station 2 is equipped with a wafer transfer section 20 adjacent to the cassette placing table 10. Provided in the wafer transfer section 20 is a wafer transfer device 22 configured to be movable along a transfer path 21 which is extended in the X direction. The wafer transfer device 22 is configured to be movable in a vertical direction and pivotable around a vertical axis (θ direction). The transfer device 22 is configured to transfer the wafers $W_U$ and $W_L$ and the combined wafer $W_T$ between the cassettes $C_U$, $C_L$ and $C_T$ placed on the cassette placing plates 11 and transition devices 50 and 51 of a third processing block G3 of the processing station 3 to be described later.

A multiple number of, for example, three processing blocks G1, G2 and G3 equipped with various kinds of apparatuses are provided in the processing station 3. For example, the first processing block G1 is provided at a front side (negative X-directional side of FIG. 1) of the processing station 3, and the second processing block G2 is provided at a rear side (positive X-directional side of FIG. 1) of the processing station 3. Further, the third processing block G3 is provided near the carry-in/out station 2 (at a negative Y direction side of FIG. 1) of the processing station 3.

Provided in the first processing block G1 is a surface modifying apparatus 30 configured to modify the surfaces $W_{U1}$ and $W_{L1}$ of the wafers $W_U$ and $W_L$. In the surface modifying apparatus 30, an oxygen gas or a nitrogen gas as a processing gas is formed into plasma under a decompressed atmosphere to be ionized. These oxygen ions or nitrogen ions are irradiated to the surfaces $W_{U1}$ and $W_{L1}$ of the wafers $W_U$ and $W_L$, so the surfaces $W_{U1}$ and $W_{L1}$ are plasma-processed to be modified.

By way of example, in the second processing block G2, a surface hydrophilizing apparatus 40 and a bonding apparatus 41 are arranged in a horizontal Y direction in this sequence from the carry-in/out station 2. The surface hydrophilizing apparatus 40 is configured to hydrophilize and clean the surfaces $W_{U1}$ and $W_{L1}$ of the wafers $W_U$ and $W_L$ with, for example, pure water. The bonding apparatus 41 is configured to bond the wafers $W_U$ and $W_L$. A configuration of the bonding apparatus 41 will be elaborated later.

In this surface hydrophilizing apparatus 40, while rotating the wafer $W_U$ ($W_L$) held by, for example, a spin chuck, the pure water is supplied onto the corresponding wafer $W_U$ ($W_L$). The supplied pure water is diffused on the surface $W_{U1}$ ($W_{L1}$) of the wafer $W_U$ ($W_L$), so that the surface $W_{U1}$ ($W_{L1}$) is hydrophilized.

By way of example, in the third processing block G3, the transition devices 50 and 51 for the wafers $W_U$ and $W_L$ and the combined wafer $W_T$ are arranged in two levels in this order from the bottom, as illustrated in FIG. 2.

Further, as illustrated in FIG. 1, a wafer transfer region 60 is formed in an area surrounded by the first processing block G1 to the third processing block G3. For example, a wafer transfer device 61 is disposed in the wafer transfer region 60.

The wafer transfer device 61 is equipped with, for example, a transfer arm 61a which is configured to be movable in a vertical direction and a horizontal direction (Y direction and X direction) and pivotable around a vertical axis. The wafer transfer device 61 is moved within the wafer transfer region 60 and transfers the wafers $W_U$ and $W_L$ and the combined wafer $W_T$ into preset apparatuses within the first processing block G1, the second processing block G2 and the third processing block G3 which are adjacent to the wafer transfer region 60.

As depicted in FIG. 1, the bonding system 1 is equipped with a controller 70. The controller 70 may be implemented by, for example, a computer and includes a program storage (not shown). The program storage stores therein programs for controlling processings on the wafers $W_U$ and $W_L$ and the combined wafer $W_T$ in the bonding system 1. Further, the program storage also stores therein programs for controlling operations of the aforementioned various kinds of the processing apparatuses and a driving system such as the transfer devices to thereby allow a wafer bonding processing to be described later to be performed in the bonding system 1. Further, the programs are stored in, for example, a computer-readable recording medium H such as a hard disk (HD), a flexible disk (FD), a compact disk (CD), a magnet optical disk (MO) or a memory card, and may be installed to the controller 70 from the recording medium H.

2. Configuration of Bonding Apparatus

Now, a configuration of the bonding apparatus 41 will be explained.

2-1. Overall Configuration of Bonding Apparatus

Figure 4:
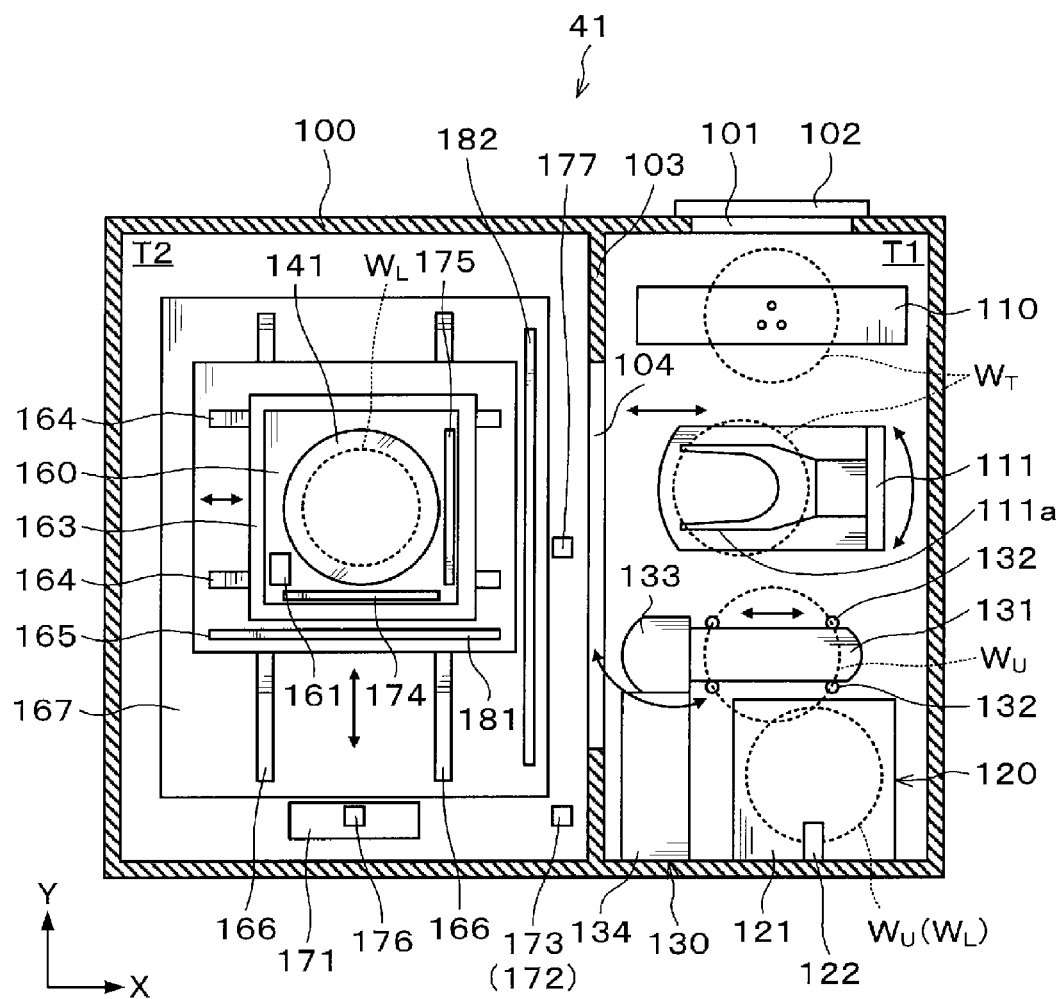
FIG. 4 is a transversal cross sectional view schematically illustrating a configuration of a bonding apparatus.
Figure 5:
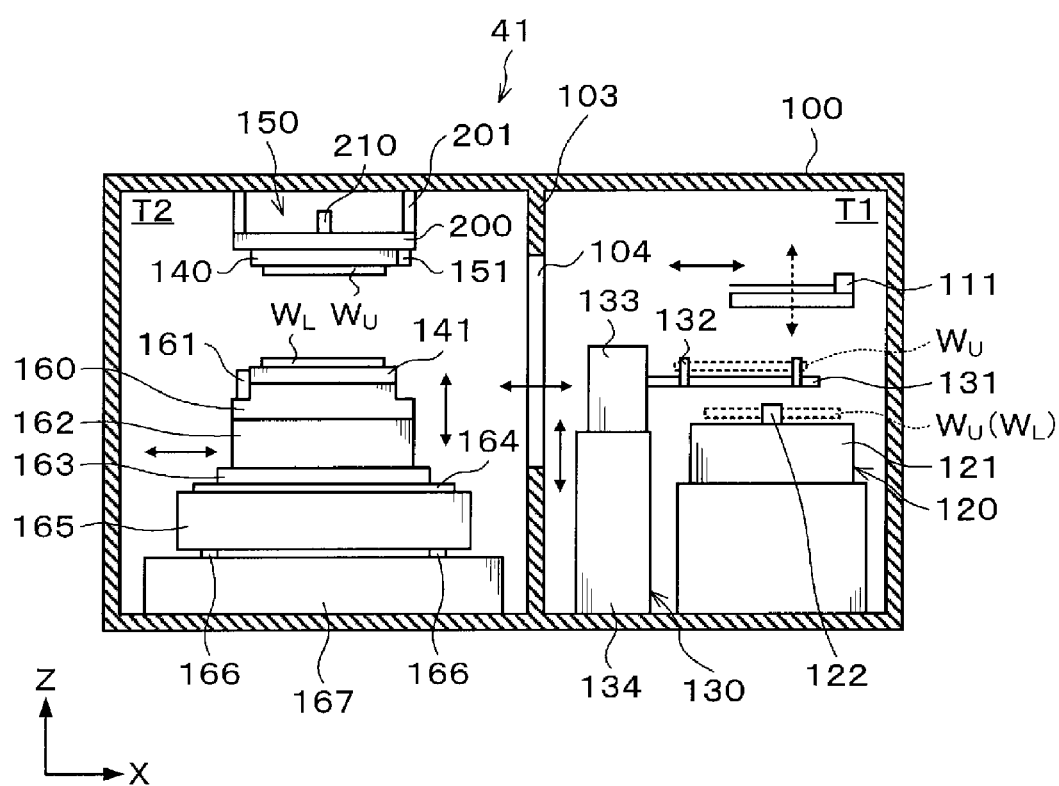
FIG. 5 is a longitudinal cross sectional view schematically illustrating the configuration of the bonding apparatus.

As depicted in FIG. 4 and FIG. 5, the bonding apparatus 41 includes a processing chamber 100 having a hermetically sealable inside. A carry-in/out opening 101 for the wafers $W_U$ and $W_L$ and the combined wafer $W_T$ is formed at a lateral side of the processing vessel 100 on the side of the wafer transfer region 60. An opening/closing shutter 102 for the carry-in/out opening 101 is provided at the carry-in/out opening 101.

The inside of the processing vessel 100 is partitioned into a transfer region T1 and a processing region T2 by an inner wall 103. The aforementioned carry-in/out opening 101 is formed at the lateral side of the processing vessel 100 in the transfer region T1. Further, the inner wall 103 is also provided with a carry-in/out opening 104 for the wafers $W_U$ and $W_L$ and the combined wafer $W_T$.

A transition 110 configured to temporarily place thereon the wafers $W_U$ and $W_L$ and the combined wafer $W_T$ is provided at a positive Y-directional side of the transfer region T1. The transition 110 has, for example, two levels and is capable of holding any two of the wafers $W_U$ and $W_L$ and the combined wafer $W_T$ at the same time.

A wafer transfer device 111 is provided within the transfer region T1. The wafer transfer device 111 is equipped with a transfer arm 111a configured to be movable in the vertical direction and the horizontal direction (X direction and Y direction) and also pivotable around a vertical axis. The wafer transfer device 111 is capable of transferring the wafers $W_U$ and $W_L$ and the combined wafer $W_T$ within the transfer region T1 or between the transfer region T1 and the processing region T2.

A position adjusting device 120 configured to adjust a direction of the wafers $W_U$ and $W_L$ in the horizontal direction is provided at a negative Y-directional side of the transfer region T1. The position adjusting device 120 includes: a base 121 equipped with a holder (not shown) configured to hold and rotate the wafer $W_U$ ($W_L$); and a detector 122 configured to detect a position of a notch of the wafer $W_U$ ($W_L$). The position adjusting device 120 adjusts the position of the notch of the wafer $W_U$ ($W_L$) by detecting the position of the notch with the detector 122 while rotating the wafer $W_U$ ($W_L$) held by the base 121. Accordingly, the horizontal positions of the wafer $W_U$ ($W_L$) is adjusted. Further, a structure configured to hold the wafer $W_U$($W_L$) in the base 121 is not particularly limited. By way of non-limiting example, various structures such as a pin chuck structure or a spin chuck structure may be utilized.

Furthermore, an inverting device 130 configured to invert a front surface and a rear surface of the upper wafer $W_U$ is provided in the transfer region T1. The inverting device 130 is equipped with a holding arm 131 configured to hold the upper wafer $W_U$. The holding arm 131 is extended in the horizontal direction (X direction). Further, the holding arm 131 is provided with holding members 132 respectively arranged at four positions. The holding members 132 are configured to hold the upper wafer $W_U$.

The holding arm 131 is supported by a driver 133 including, for example, a motor or the like. The holding arm 131 is configured to be rotatable around a horizontal axis by the driver 133. Further, the holding arm 131 is rotatable around the driver 133 and movable in the horizontal direction (X direction). Another driver (not shown) including, for example, a motor or the like is provided under the driver 133. The driver 133 can be moved in the vertical direction along a vertically extended supporting column 134 by this another driver. The upper wafer $W_U$ held by the holding members 132 can be rotated around the horizontal axis and can also be moved in the vertical direction and the horizontal direction by the driver 133. Further, the upper wafer $W_U$ held by the holding members 132 can be moved between the position adjusting device 120 and an upper chuck 140 to be described later by being rotated around the driver 133.

The upper chuck 140 and a lower chuck 141 are disposed in the processing region T2. The upper chuck 140 serves as a first holder configured to attract and hold the upper wafer $W_U$ on a bottom surface thereof, and the lower chuck 141 serves as a second holder configured to place the lower wafer $W_L$ on a top surface thereof while attracting and holding the lower wafer $W_L$. The lower chuck 141 is provided under the upper chuck 140 and is configured to be disposed to face the upper chuck 140. That is, the upper wafer $W_U$ held by the upper chuck 140 and the lower wafer $W_L$ held by the lower chuck 141 can be arranged to face each other.

The upper chuck 140 is held by an upper chuck holder 150 disposed above the upper chuck 140. The upper chuck holder 150 is provided at a ceiling surface of the processing vessel 100. That is, the upper chuck 140 is fixed to the processing vessel 100 with the upper chuck holder 150 therebetween.

The upper chuck holder 150 is equipped with an upper imaging device 151 configured to image the front surface $W_{L1}$ of the lower wafer $W_L$ held by the lower chuck 141. That is, the upper imaging device 151 is disposed adjacent to the upper chuck 140. The upper imaging device 151 may be, by way of example, but not limitation, a CCD camera.

Figure 6:
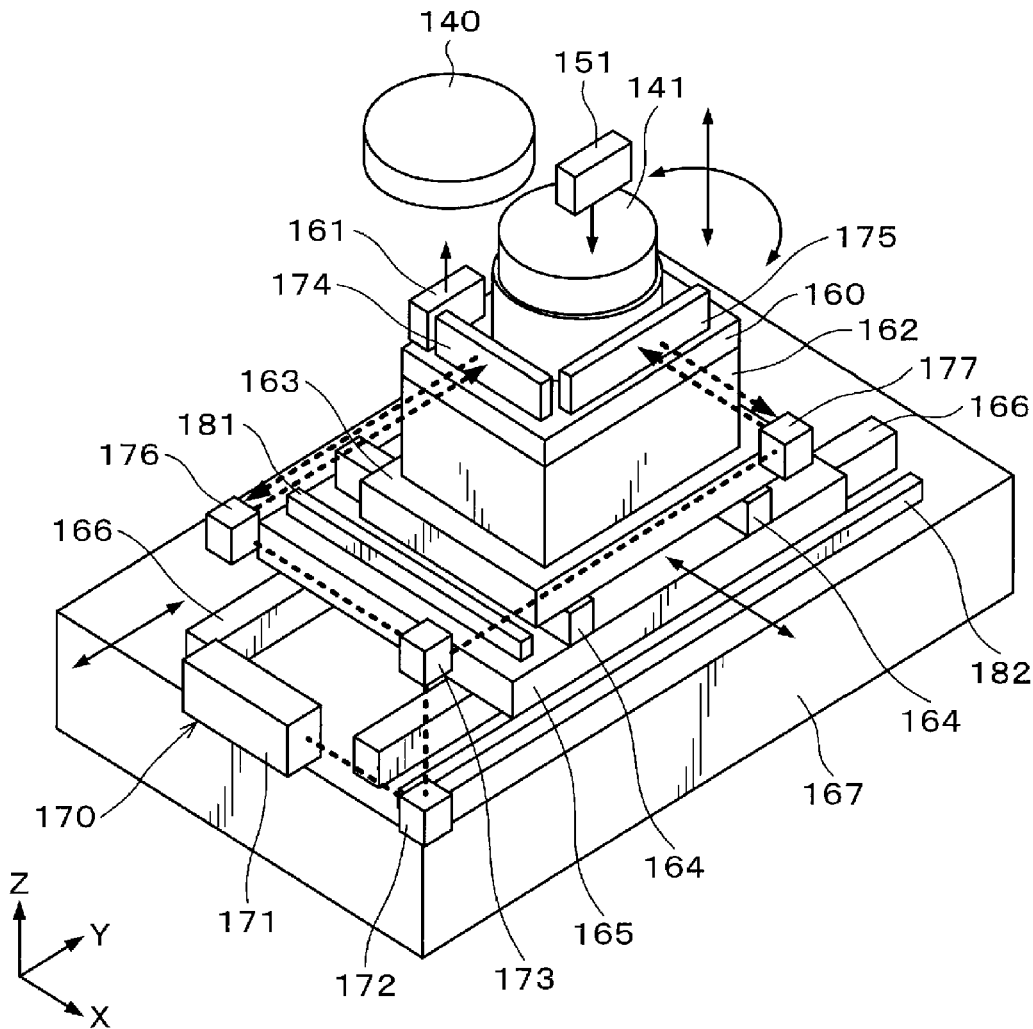
FIG. 6 is a perspective view schematically illustrating an internal configuration of the bonding apparatus.

As depicted in FIG. 4 to FIG. 6, the lower chuck 141 is supported by a lower chuck stage 160 provided under the lower chuck 141. The lower chuck stage 160 is equipped with a lower imaging device 161 configured to image the front surface $W_{U1}$ of the upper wafer $W_U$ held by the upper chuck 140. That is, the lower imaging device 161 is disposed adjacent to the lower chuck 141. The lower imaging device 161 may be, by way of example, but not limitation, a CCD camera.

The lower chuck stage 160 is supported by a first lower chuck mover 162 disposed under the lower chuck stage 160. Further, the first lower chuck mover 162 is supported by a supporting table 163. The first lower chuck mover 162 is configured to move the lower chuck 141 in the horizontal direction (X direction) as will be described later.

Further, the first lower chuck mover 162 is configured to be capable of moving the lower chuck 141 in the vertical direction. To elaborate, the first lower chuck mover 162 may have the same structure as a first lower chuck mover described in Japanese Patent Laid-open Publication No. 2016-105458. That is, the first lower chuck mover 162 is equipped with: a base having a wedge shape (triangular prism shape) with an inclined top surface; a rail disposed on the top surface of the base; and a linear guide configured to be movable along the rail. As the linear guide is moved along the rail, the lower chuck supported by the linear guide is moved in the vertical direction.

Further, the first lower chuck mover 162 is configured to be rotatable around a vertical axis.

The supporting table 163 is fastened to a pair of rails 164 which is disposed at a bottom side of the supporting table 163 to be elongated in the horizontal direction (X direction). The supporting table 163 is configured to be movable along the rails 164 by the first lower chuck mover 162. Further, the first lower chuck mover 162 is moved by, for example, a linear motor (not shown) provided along the rails 164.

The rails 164 are provided at a second lower chuck mover 165. The second lower chuck mover 165 is fastened to a pair of rails 166 which is provided at a bottom side of the second lower chuck mover 165 to be elongated in the horizontal direction (Y direction). The second lower chuck mover 165 is configured to be movable along the rails 166, that is, to move the lower chuck 141 in the horizontal direction (Y direction). The second lower chuck mover 165 is moved by, for example, a linear motor (not shown) provided along the rails 166. The rails 166 are disposed on a placing table 167 provided at a bottom surface of the processing vessel 100.

2-2. Servo Control Over Lower Chuck Movers

Now, a movement of the first lower chuck mover 162 and a servo control of the second lower chuck mover 165 in the bonding apparatus 41 will be explained. The servo control in the present exemplary embodiment is a hybrid control using a laser interferometer and a linear scale.

The bonding apparatus 41 is equipped with a laser interferometer system 170 configured to measure a position of the lower chuck 141 in the horizontal direction. The laser interferometer system 170 includes a laser head 171, optical path changers 172 and 173, reflection plates 174 and 175 and laser interferometers 176 and 177. Further, a commonly known method is used to measure the position of the lower chuck 141 in the laser interferometer system 170.

The laser head 171 is a light source configured to emit a laser beam. The laser head 171 is substantially on the level with a top surface of a placing table 167 and is provided at an end side of the placing table 167 in the negative Y direction and provided at a center of the placing table 167 in the X direction. The laser head 171 is supported by a supporter (not shown) provided at an outside of the placing table 167.

The optical path changers 172 and 173 are respectively configured to change an optical path of the laser beam emitted from the laser head 171. The first optical path changer 172 is configured to change the optical path of the laser beam from the laser head 171 to a vertically upward direction. The first optical path changer 172 is substantially on the level with the top surface of the placing table 167, and is disposed at an end side of the placing table 167 in the positive X direction and disposed at an end side of the placing table 167 in the negative Y direction. Further, the first optical path changer 172 is supported by a supporter (not shown) provided at the outside of the placing table 167.

The second optical path changer 173 is configured to branch the laser beam from the first optical path changer 172 toward the first laser interferometer 176 (negative X direction) and the second laser interferometer 177 (positive Y direction) respectively. The second optical path changer 173 is substantially on the level with a top surface of the lower chuck stage 160 and is disposed at an end side of the placing table 167 in the positive X direction and disposed at an end side of the placing table 167 in the negative Y direction. Further, the second optical path changer 173 is supported by a supporter (not shown) provided at the outside of the placing table 167.

The first reflection plate 174 is configured to reflect the laser beam from the first laser interferometer 176. The first reflection plate 174 is disposed to face the first laser interferometer 176 on the top surface of the lower chuck stage 160 at the negative Y direction side. The first reflection plate 174 is extended in the X direction. A length of the first reflection plate 174 in the X direction is set to be equal to or larger than a moving distance (stroke length) of the lower chuck stage 160 in the X direction such that the first reflection plate 174 is capable of reflecting the laser beam from the first laser interferometer 176 all the time even if the lower chuck stage 160 is moved in the X direction. Likewise, a length of the first reflection plate 174 in the vertical direction is set to be equal to or larger than a moving distance (stroke length) of the lower chuck stage 160 in the vertical direction.

The second reflection plate 175 is configured to reflect the laser beam from the second laser interferometer 177. The second reflection plate 175 is disposed to face the second laser interferometer 177 on the top surface of the lower chuck stage 160 at the positive X direction side. The second reflection plate 175 is extended in the Y direction. A length of the second reflection plate 175 in the Y direction is set to be equal to or larger than a moving distance (stroke length) of the lower chuck stage 160 in the Y direction such that the second reflection plate 175 is capable of reflecting the laser beam from the second laser interferometer 177 all the time even if the lower chuck stage 160 is moved in the Y direction. Likewise, a length of the second reflection plate 175 in the vertical direction is set to be equal to or larger than a moving distance (stroke length) of the lower chuck stage 160 in the vertical direction.

The first laser interferometer 176 is configured to measure a position of the lower chuck 141 in the X direction by using the laser beam from the second optical path changer 173 and the reflection light from the first reflection plate 174. The first laser interferometer 176 is substantially on the level with the top surface of the lower chuck stage 160, and is disposed at the central position of the placing table 167 in the X direction and disposed at the end side of the placing table 167 in the negative Y direction. Further, the first laser interferometer 176 is supported by a supporter (not shown) provided at the outside of the placing table 167. Further, the first laser interferometer 176 is connected with a detector (not shown).

The second laser interferometer 177 is configured to measure a position of the lower chuck 141 in the Y direction by using the laser beam from the second optical path changer 173 and the reflection light from the second reflection plate 175. The second laser interferometer 177 is substantially on the level with the top surface of the lower chuck stage 160, and is disposed at the end side of the placing table 167 in the positive X direction and disposed at the center position of the placing table 167 in the Y direction. Further, the second laser interferometer 177 is supported by a supporter (not shown) provided at the outside of the placing table 167. Furthermore, the second laser interferometer 177 is connected with a detector (not shown).

Further, the bonding apparatus 41 is equipped with a first linear scale 181 configured to measure a position of the first lower chuck mover 162 in the X direction and a second linear scale 182 configured to measure a position of the second lower chuck mover 165 in the Y direction. The first linear scale 181 is provided on the second lower chuck mover 165 along the rail 164. The second linear scale 182 is provided on the placing table 167 along the rail 166. For the measurement of the positions of the lower chuck movers 162 and 165 by these linear scales 181 and 182, a commonly known method may be used.

Figure 7:
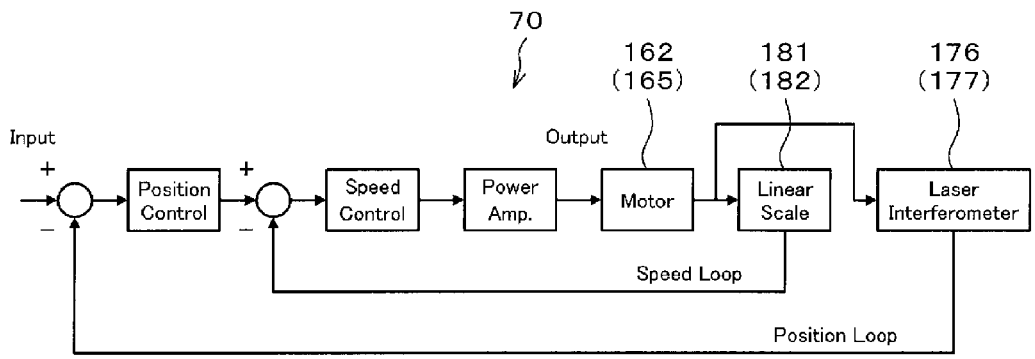
FIG. 7 is an explanatory diagram illustrating a configuration of a servo loop in a controller.

Measurement results of the laser interferometer system 170 and measurement results of the linear scales 181 and 182 are outputted to the aforementioned controller 70, and the controller 70 performs a servo control over the lower chuck movers 162 and 165 based on these measurement results. FIG. 7 is an explanatory diagram illustrating a configuration of a servo loop in the controller 70.

The controller 70 has a position loop and a speed loop as the servo loop. The measurement results of the laser interferometers 176 and 177 are used in the position loop, and the positions of the lower chuck movers 162 and 165 are feedback-controlled. The measurement results of the linear scales 181 and 182 are used in the speed loop, and the speeds of the lower chuck movers 162 and 165 are feedback-controlled. Further, the measurement results of the laser interferometers 176 and 177 are also used as speed instructions.

Here, the second linear scale 182 is placed in the vicinity of the second lower chuck mover 165, and the measurement result of the second linear scale 182 is fed back to the second lower chuck mover 165 as highly stable data. Therefore, responsiveness can be improved by increasing a gain of the speed loop, so that a rapid control can be carried out.

Meanwhile, a distance between the second laser interferometer 177 configured to measure the position of the lower chuck 141 at the load side and the second lower chuck mover 165 (linear motor) in the vertical direction is about 300 mm. That is, the second laser interferometer 177 and the second lower chuck mover 165 are spaced apart from each other, and a structure provided between the lower chuck 141 and the second lower chuck mover 165 is not a rigid body. Accordingly, the measurement result of the second laser interferometer 177 is fed back to the second lower chuck mover 165 as low-stability data. In such a case, if the measurement result of the second laser interferometer 177 is put in the speed loop and the rapid control with the improved responsiveness by increasing the gain as stated above is performed, the movement of the second lower chuck mover 165 may be oscillated, so that it may be impossible to control the second lower chuck mover 165. Furthermore, if the measurement result of the second laser interferometer 177 is put in the speed loop, it may be considered to perform a slow control with lowered responsiveness by decreasing the gain. In such a case, however, the position of the second lower chuck mover 165 may not be stabilized.

Therefore, to perform a control with the high responsiveness, it is desirable to use the measurement result of the second linear scale 182 in the speed loop.

Meanwhile, in the second linear scale 182, the position of the lower chuck 141 at the load side cannot be measured. Accordingly, even if the position of the lower chuck 141 is deviated, for example, such a deviation may not be detected. Thus, it is desirable to use the measurement result of the second laser interferometer 177 in the position loop.

As stated above, if the measurement result of the second laser interferometer 177 is used in the position loop and the measurement result of the second linear scale 182 is used in the speed loop, it is possible to return the second lower chuck mover 165 to an appropriate position when there is a change in the lower chuck 141 while being capable of detecting the position of the lower chuck 141 at the load side.

For the same reason, the measurement result of the first laser interferometer 176 is used in the position loop, and the measurement result of the first linear scale 181 is used in the speed loop.

As described above, in the servo control over the lower chuck movers 162 and 165, by performing the hybrid control using the measurement results of the laser interferometer system 170 and the measurement results of the linear scales 181 and 182, the lower chuck movers 162 and 165 can be controlled appropriately.

2-3. Configuration of Upper Chuck and Upper Chuck Holder

Now, a detailed configuration of the upper chuck 140 and the upper chuck holder 150 of the bonding apparatus 41 will be discussed.

Figure 8:
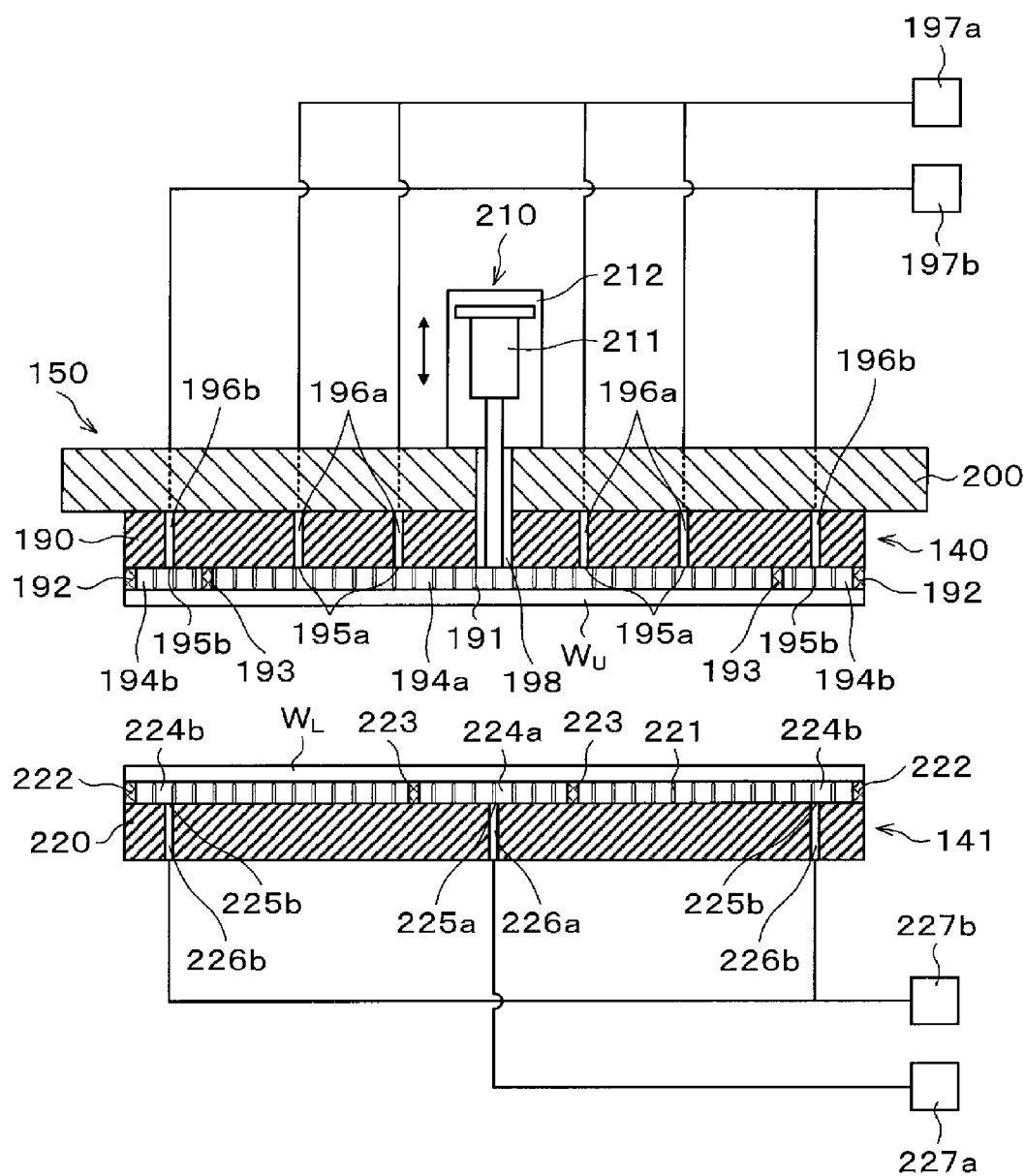
FIG. 8 is a longitudinal cross sectional view schematically illustrating a configuration of an upper chuck, an upper chuck holder and a lower chuck.

The upper chuck 140 is of a pin chuck type, as shown in FIG. 8. The upper chuck 140 has a main body 190 having a diameter larger than a diameter of the upper wafer $W_U$ when viewed from the top. A plurality of pins 191 configured to be brought into contact with the rear surface $W_{U2}$ of the upper wafer $W_U$ is provided at a bottom surface of the main body 190. Further, an outer rib 192 having the same height as the pins 191 and configured to support a periphery of the rear surface $W_{U2}$ of the upper wafer $W_U$ is provided at a periphery of the bottom surface of the main body 190. The outer rib 192 is annularly formed at an outside of the pins 191.

Further, an inner rib 193 having the same height as the pins 191 and configured to support the rear surface $W_{U2}$ of the upper wafer $W_U$ is provided at an inside of the outer rib 192 on the bottom surface of the main body 190. The inner rib 193 is formed in a ring shape to be concentric with the outer rib 192. A region 194 inside the outer rib 192 (hereinafter, sometimes referred to as "suction region 194") is partitioned into a first suction region 194a inside the inner rib 193 and a second suction region 194b outside the inner rib 193.

First suction openings 195a for vacuum-exhausting the upper wafer $W_U$ in the first suction region 194a are formed at the bottom surface of the main body 190. The first suction openings 195a are formed at, for example, four positions in the first suction region 194a. The first suction openings 195a are connected to first suction lines 196a which are provided within the main body 190. Further, the first suction lines 196a are connected with a first vacuum pump 197a.

In addition, second suction openings 195b for vacuum-exhausting the upper wafer $W_U$ in the second suction region 194b are formed at the bottom surface of the main body 190. The second suction openings 195b are formed at, for example, two positions within the second suction region 194b. The second suction openings 195b are connected to second suction lines 196b provided within the main body 190. Further, the second suction lines 196b are connected with a second vacuum pump 197b.

By vacuum-exhausting the suction regions 194a and 194b formed by being surrounded by the upper wafer $W_U$, the main body 190 and the outer rib 192 through the suction openings 195a and 195b, respectively, the suction regions 194a and 194b are decompressed. At this time, since an atmosphere at the outside of the suction regions 194a and 194b is under an atmospheric pressure, the upper wafer $W_U$ is pressed toward the suction regions 194a and 194b by the atmospheric pressure as much as a decompressed amount, so that the upper wafer $W_U$ is attracted to and held by the upper chuck 140. Further, the upper chuck 140 is configured to be capable of vacuum-exhausting the upper wafer $W_U$ through the first suction region 194a and the second suction region 194b individually.

In this case, since the outer rib 192 supports the periphery of the rear surface $W_{U2}$ of the upper wafer $W_U$, the upper wafer $W_U$ is appropriately vacuum-exhausted, including the periphery thereof. Therefore, the entire surface of the upper wafer $W_U$ is attracted to and held by the upper chuck 140, and flatness of the upper wafer $W_U$ can be reduced and the upper wafer $W_U$ can thus be flattened.

Furthermore, since the heights of the pins 191 are uniform, flatness of the bottom surface of the upper chuck 140 can be further reduced. In this way, by flattening the bottom surface (by reducing the flatness of the bottom surface) of the upper chuck 140, the upper wafer $W_U$ held by the upper chuck 140 can be suppressed from suffering from a deformation in the vertical direction.

Further, since the rear surface $W_{U2}$ of the upper wafer $W_U$ is supported by the pins 191, it is easy for the upper wafer $W_U$ to be separated from the upper chuck 140 when releasing the vacuum-exhaust of the upper wafer $W_U$ by the upper chuck 140.

The upper chuck 140 is provided with a through hole 198 which is formed through a center of the main body 190 in a thickness direction of the main body 190. The center of this main body 190 corresponds to a center of the upper wafer $W_U$ held by and attracted to the upper chuck 140. A leading end of an actuator 211 of a pressing member 210 to be described later is inserted through this through hole 198.

The upper chuck holder 150 is equipped with an upper chuck stage 200 provided on a top surface of the main body 190 of the upper chuck 140, as depicted in FIG. 5. When viewed from the top, the upper chuck stage 200 is configured to cover at least the top surface of the main body 190 and is fastened to the main body 190 by, for example, a screw. The upper chuck stage 200 is supported by a plurality of supporting members 201 provided at the ceiling surface of the processing vessel 100.

The pressing member 210 configured to press the center of the upper wafer $W_U$ is further provided on a top surface of the upper chuck stage 200, as shown in FIG. 8. The pressing member 210 has the actuator 211 and a cylinder 212.

The actuator 211 is configured to generate a constant pressure in a certain direction by air supplied from an electro-pneumatic regulator (not shown), and is capable of generating the pressure constantly regardless of a position of a point of application of the pressure. The actuator 211 is capable of controlling a pressing load applied to the center of the upper wafer $W_U$ by the air from the electro-pneumatic regulator while the actuator 211 comes into contact with the center of the upper wafer $W_U$. Further, the leading end of the actuator 211 is vertically movable up and down through the through hole 198 by the air from the electro-pneumatic regulator.

The actuator 211 is supported by the cylinder 212. The cylinder 212 is capable of moving the actuator 211 in the vertical direction by a driver having, for example, a motor embedded therein.

As stated above, the pressing member 210 controls the pressing load with the actuator 211 and controls the movement of the actuator 211 with the cylinder 212. The pressing member 210 is capable of pressing the center of the upper wafer $W_U$ and a center of the lower wafer $W_L$ when bonding of the wafers $W_U$ and $W_L$ to be described later is performed.

2-4. Configuration of Lower Chuck

Now, a detailed configuration of the lower chuck 141 of the bonding apparatus 41 will be explained.

The lower chuck 141 is of a pin chuck type, the same as the upper chuck 140, as shown in FIG. 8. The lower chuck 141 has a main body 220 having a diameter larger than a diameter of the lower wafer $W_L$ when viewed from the top. A plurality of pins 221 configured to be brought into contact with the rear surface $W_{L2}$ of the lower wafer $W_L$ is provided at a top surface of the main body 220. Further, an outer rib 222 having the same height as the pins 221 and configured to support a periphery of the rear surface $W_{L2}$ of the lower wafer $W_L$ is provided at a periphery of the top surface of the main body 220. The outer rib 222 is annularly formed at an outside of the pins 221.

Further, an inner rib 223 having the same height as the pins 221 and configured to support the rear surface $W_{L2}$ of the lower wafer $W_L$ is provided at an inside of the outer rib 222 on the top surface of the main body 220. The inner rib 223 is formed in a ring shape to be concentric with the outer rib 222. A region 224 inside the outer rib 222 (hereinafter, sometimes referred to as "suction region 224") is partitioned into a first suction region 224a inside the inner rib 223 and a second suction region 224b outside the inner rib 223.

A first suction opening 225a for vacuum-exhausting the lower wafer $W_L$ in the first suction region 224a is formed at the top surface of the main body 220. The first suction opening 225a is formed at, for example, a single position in the first suction region 224a. The first suction opening 225a is connected to a first suction line 226a which is provided within the main body 220. Further, the first suction line 226a is connected with a first vacuum pump 227a.

In addition, second suction openings 225b for vacuum-exhausting the lower wafer $W_L$ in the second suction region 224b are formed at the top surface of the main body 220. The second suction openings 225b are formed at, for example, two positions within the second suction region 224b. The second suction openings 225b are connected to second suction lines 226b provided within the main body 220. Further, the second suction lines 226b are connected with a second vacuum pump 227b.

By vacuum-exhausting the suction regions 224a and 224b formed by being surrounded by the lower wafer $W_L$, the main body 220 and the outer rib 222 through the suction openings 225a and 225b, respectively, the suction regions 224a and 224b are decompressed. At this time, since an atmosphere at the outside of the suction regions 224a and 224b is under the atmospheric pressure, the lower wafer $W_L$ is pressed toward the suction regions 224a and 224b by the atmospheric pressure as much as a decompressed amount, so that the lower wafer $W_L$ is attracted to and held by the lower chuck 141. Further, the lower chuck 141 is configured to be capable of vacuum-exhausting the lower wafer $W_L$ through the first suction region 224a and the second suction region 224b individually.

In this case, since the outer rib 222 supports the periphery of the rear surface $W_{L2}$ of the lower wafer $W_L$, the lower wafer $W_L$ is appropriately vacuum-exhausted, including the periphery thereof. Therefore, the entire surface of the lower wafer $W_L$ is attracted to and held by the lower chuck 141, and flatness of the lower wafer $W_L$ can be reduced and the lower wafer $W_L$ can thus be flattened.

Furthermore, since the heights of the pins 221 are uniform, flatness of the top surface of the lower chuck 141 can be further reduced. In this way, by flattening the top surface (by reducing the flatness of the top surface) of the lower chuck 141, the lower wafer $W_L$ held by the lower chuck 141 can be suppressed from suffering from a deformation in a vertical direction.

Further, since the rear surface $W_{L2}$ of the lower wafer $W_L$ is supported by the pins 221, it is easy for the lower wafer $W_L$ to be separated from the lower chuck 141 when releasing the vacuum-exhaust of the lower wafer $W_L$ by the lower chuck 141.

The lower chuck 141 is provided with through holes (not shown) which are formed in a thickness direction of the main body 220 at, e.g., three positions in the vicinity of a center of the main body 220. Elevating pins provided under the first lower chuck mover 162 are inserted through these through holes.

Guide members (not shown) are provided at a periphery of the main body 220 to suppress each of the wafers $W_U$ and $W_L$ and the combined wafer $W_T$ from falling down by being bounced off or slid off the lower chuck 141. The guide members are equi-spaced at plural positions, for example, four positions at the periphery of the main body 220.

The operations of the individual components of the bonding apparatus 41 are controlled by the aforementioned controller 70.

3. Bonding Method

Figure 9:
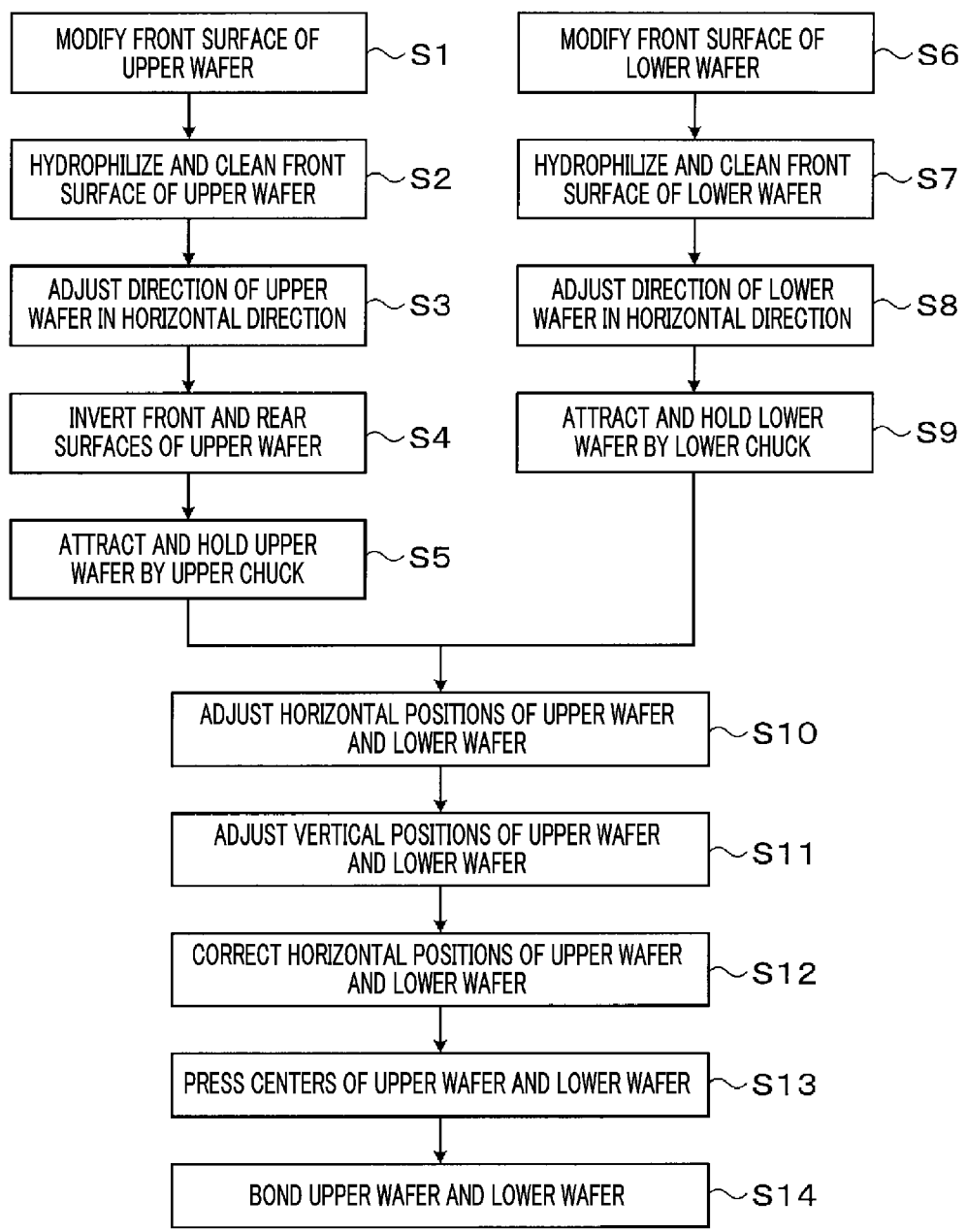
FIG. 9 is a flowchart illustrating major processes of a wafer bonding processing.

Now, a bonding method for the wafers $W_U$ and $W_L$ performed by the bonding system 1 configured as described above will be explained. FIG. 9 is a flowchart illustrating an example of main processes of such a wafer bonding processing.

First, a cassette $C_U$ accommodating the upper wafers $W_U$, a cassette $C_L$ accommodating the lower wafers $W_L$ and an empty cassette $C_T$ are placed on the preset cassette placing plates 11 of the carry-in/out station 2. Then, an upper wafer $W_U$ is taken out of the cassette $C_U$ by the wafer transfer device 22 and is transferred to the transition device 50 of the third processing block G3 of the processing station 3.

Subsequently, the upper wafer $W_U$ is transferred into the surface modifying apparatus 30 of the first processing block G1 by the wafer transfer device 61. In the surface modifying apparatus 30, an oxygen gas or a nitrogen gas as the processing gas is excited into plasma to be ionized under the preset decompressed atmosphere. The oxygen ions or the nitrogen ions are irradiated to the front surface $W_{U1}$ of the upper wafer $W_U$, and the front surface $W_{U1}$ is plasma-processed. As a result, the front surface $W_{U1}$ of the upper wafer $W_U$ is modified (process S1 of FIG. 9).

Then, the upper wafer $W_U$ is transferred into the surface hydrophilizing apparatus 40 of the second processing block G2 by the wafer transfer device 61. In the surface hydrophilizing apparatus 40, pure water is supplied onto the upper wafer $W_U$ while rotating the upper wafer $W_U$ held by the spin chuck. The supplied pure water is diffused on the front surface $W_{U1}$ of the upper wafer $W_U$, and hydroxyl groups (silanol groups) adhere to the front surface $W_{U1}$ of the upper wafer $W_U$ modified in the surface modifying apparatus 30, so that the front surface $W_{U1}$ is hydrophilized. Further, the front surface $W_{U1}$ of the upper wafer $W_U$ is cleaned by the pure water (process S2 of FIG. 9).

Thereafter, the upper wafer $W_U$ is transferred into the bonding apparatus 41 of the second processing block G2 by the wafer transfer device 61. The upper wafer $W_U$ carried into the bonding apparatus 41 is then transferred into the position adjusting device 120 through the transition 110 by the wafer transfer device 111. Then, the direction of the upper wafer $W_U$ in the horizontal direction is adjusted by the position adjusting device 120 (process S3 of FIG. 9).

Then, the upper wafer $W_U$ is delivered onto the holding arm 131 of the inverting device 130 from the position adjusting device 120. Then, in the transfer region T1, by inverting the holding arm 131, the front surface and the rear surface of the upper wafer $W_U$ are inverted (process S4 of FIG. 9). That is, the front surface $W_{U1}$ of the upper wafer $W_U$ is turned to face downwards.

Thereafter, the holding arm 131 of the inverting device 130 is rotated around the driver 133 to be located under the upper chuck 140. The upper wafer $W_U$ is then transferred to the upper chuck 140 from the inverting device 130. The rear surface $W_{U2}$ of the upper wafer $W_U$ is attracted to and held by the upper chuck 140 (process S5 of FIG. 9). To elaborate, by operating the vacuum pumps 197a and 197b, the upper wafer $W_U$ is vacuum-exhausted through the suction openings 195a and 195b in the suction regions 194a and 194b, so that the upper wafer $W_U$ is attracted to and held by the upper chuck 140.

While the above-described processes S1 to S5 are being performed on the upper wafer $W_U$, processings are performed on the lower wafer $W_L$. First, the lower wafer $W_L$ is taken out of the cassette $C_L$ by the wafer transfer device 22 and transferred into the transition device 50 of the processing station 3.

Subsequently, the lower wafer $W_L$ is transferred into the surface modifying apparatus 30 by the wafer transfer device 61, and the front surface $W_{L1}$ of the lower wafer $W_L$ is modified (process S6 of FIG. 9). Further, the modification of the front surface $W_{L1}$ of the lower wafer $W_L$ in the process S6 is the same as the above-described process S1.

Thereafter, the lower wafer $W_L$ is transferred into the surface hydrophilizing apparatus 40 by the wafer transfer device 61, so that the front surface $W_{L1}$ of the lower wafer $W_L$ is hydrophilized and cleaned (process S7 of FIG. 9). The hydrophilizing and the cleaning of the front surface $W_{L1}$ of the lower wafer $W_L$ in the process S7 are the same as those in the above-described process S2.

Afterwards, the lower wafer $W_L$ is transferred into the bonding apparatus 41 by the wafer transfer device 61. The lower wafer $W_L$ carried into the bonding apparatus 41 is transferred into the position adjusting device 120 through the transition 110 by the wafer transfer device 111. Then, the direction of the lower wafer $W_L$ in the horizontal direction is adjusted by the position adjusting device 120 (process S8 of FIG. 9).

Then, the lower wafer $W_L$ is transferred onto the lower chuck 141 by the wafer transfer device 111, and the rear surface $W_{L2}$ is attracted to and held by the lower chuck 141 (process S9 of FIG. 9). To elaborate, by operating the vacuum pumps 227a and 227b, the lower wafer $W_L$ is vacuum-exhausted through the suction openings 225a and 225b in the suction regions 224a and 224b, so that the lower wafer $W_L$ is attracted to and held by the lower chuck 141.

Subsequently, position adjustment between the upper wafer $W_U$ held by the upper chuck 140 and the lower wafer $W_L$ held by the lower chuck 141 in the horizontal direction is performed. To elaborate, the lower chuck 141 is moved in the horizontal direction (X direction and Y direction) by the first lower chuck mover 162 and the second lower chuck mover 165, and preset reference points on the front surface $W_{L1}$ of the lower wafer $W_L$ are imaged in sequence by using the upper imaging device 151. Concurrently, preset reference points on the front surface $W_{U1}$ of the upper wafer $W_U$ are imaged in sequence by using the lower imaging device 161. The obtained images are outputted to the controller 70. Based on the images obtained by the upper imaging device 151 and the lower imaging device 161, the controller 70 moves the lower chuck 141 by the first lower chuck mover 162 and the second lower chuck mover 165 to a position where the reference points of the upper wafer $W_U$ and the lower wafer Mare overlapped. In this way, the positions of the upper wafer $W_U$ and the lower wafer $W_L$ in the horizontal direction are adjusted (process S10 of FIG. 9).

In the process S10, the position of the lower chuck 141 in the X direction is measured by using the first laser interferometer 176, and the position of the lower chuck 141 in the Y direction is measured by using the second laser interferometer 177. Further, the position of the first lower chuck mover 162 in the X direction is measured by using the first linear scale 181, and the position of the second lower chuck mover 165 in the Y direction is measured by using the second linear scale 182. When moving the lower chuck movers 162 and 165, the lower chuck movers 162 and 165 are servo-controlled by using the servo loop shown in FIG. 7, that is, by using the position loop using the measurement results of the laser interferometer system 170 and the speed loop using the measurement results of the linear scales 181 and 182. By performing the hybrid control using the laser interferometer system 170 and the linear scales 181 and 182 as stated above, the movement of the lower chuck movers 162 and 165 can be controlled appropriately, so that the lower chuck 141 can be moved to a preset horizontal position.

Further, in the process S10, the lower chuck 141 is moved in the horizontal direction as stated above, and the position of the lower chuck 141 in the rotational direction (the direction of the lower chuck 141) is also adjusted by rotating the lower chuck 141 by the first lower chuck mover 162.

Thereafter, by moving the lower chuck 141 vertically upwards by the first lower chuck mover 162, position adjustment between the upper chuck 140 and the lower chuck 141 in the vertical direction is performed, so that position adjustment between the upper wafer $W_U$ held by the upper chuck 140 and the lower wafer $W_L$ held by the lower chuck 141 in the vertical direction is carried out (process S11 of FIG. 9).

In the process S11, when moving the lower chuck 141 vertically upwards by the first lower chuck mover 162, the lower chuck 141 is also moved in the horizontal direction as the base of the first lower chuck mover 162 has the wedge shape. Resultantly, the horizontal position of the lower chuck 141 adjusted in the process S10 is deviated.

Accordingly, as in the process S10, the position of the lower chuck 141 in the X direction is measured by using the first laser interferometer 176, and the position of the lower chuck 141 in the Y direction is measured by using the second laser interferometer 177. Further, the position of the first lower chuck mover 162 in the X direction is measured by using the first linear scale 181, and the position of the second lower chuck mover 165 in the Y direction is measured by using the second linear scale 182. Then, by servo-controlling the lower chuck movers 162 and 165 with the position loop using the measurement results of the laser interferometer system 170 and the speed loop using the measurement results of the linear scales 181 and 182, the position of the lower chuck 141 in the horizontal direction is corrected. Accordingly, the positions of the upper wafer $W_U$ and the lower wafer $W_L$ in the horizontal direction are corrected (process S12 of FIG. 9), and, thus, the upper wafer $W_U$ and the lower wafer $W_L$ are disposed to face each other at the preset positions.

Subsequently, a bonding processing of bonding the upper wafer $W_U$ held by the upper chuck 140 and the lower wafer $W_L$ held by the lower chuck 141 is performed.

Figure 10:
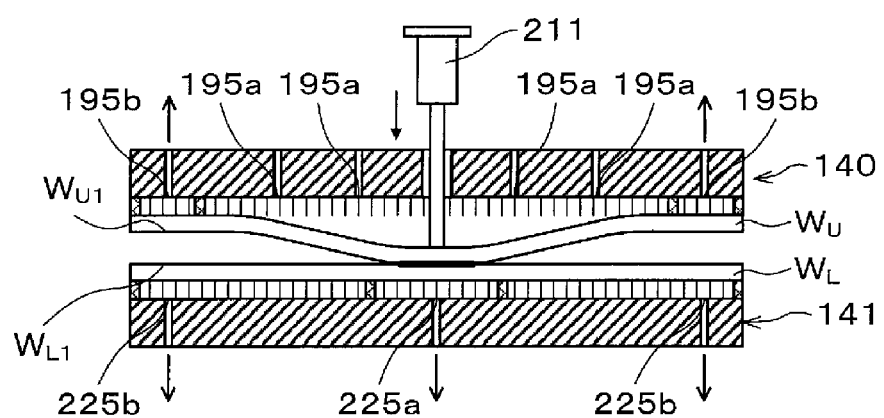
FIG. 10 is an explanatory diagram illustrating a state in which a center of the upper wafer and a center of the lower wafer are pressed to be brought into contact with each other.

First, as depicted in FIG. 10, the actuator 211 is lowered by the cylinder 212 of the pressing member 210. As the actuator 211 is moved down, the center of the upper wafer $W_U$ is lowered while being pressed. At this time, the preset pressing load is applied to the actuator 211 by the air supplied from the electro-pneumatic regulator. The center of the upper wafer $W_U$ and the center of the lower wafer Mare pressed to be in contact with each other by the pressing member 210 (process S13 of FIG. 9). At this time, by stopping the operation of the vacuum pump 197a, the vacuum-exhaust of the upper wafer $W_U$ from the first suction openings 195a in the first suction region 194a is stopped, while carrying on the operation of the second vacuum pump 197b to vacuum-exhaust the second suction region 194b from the second suction openings 195b. When pressing the center of the upper wafer $W_U$ with the pressing member 210, the periphery of the upper wafer $W_U$ can still be held by the upper chuck 140.

Accordingly, the bonding is started between the center of the upper wafer $W_U$ and the center of the lower wafer $W_L$ which are pressed against each other (as indicted by a bold line in FIG. 10). That is, since the front surface $W_{U1}$ of the upper wafer $W_U$ and the front surface $W_{L1}$ of the lower wafer $W_L$ have been modified in the processes S1 and S6, respectively, a Van der Waals force (intermolecular force) is generated between the front surfaces $W_{U1}$ and $W_{L1}$, so that the front surfaces $W_{U1}$ and $W_{L1}$ are bonded. Further, since the front surface $W_{U1}$ of the upper wafer $W_U$ and the front surface $W_{L1}$ of the lower wafer $W_L$ have been hydrophilized in the processes S2 and S7, respectively, hydrophilic groups between the front surfaces $W_{U1}$ and $W_{L1}$ are hydrogen-bonded (intermolecular force), so that the front surfaces $W_{U1}$ and $W_{L1}$ are firmly bonded.

Then, by stopping the operation of the second vacuum pump 197b while still pressing the center of the upper wafer $W_U$ and the center of the lower wafer $W_L$ with the pressing member 210, the vacuum-exhaust of the upper wafer $W_U$ from the second suction openings 195b in the second suction region 194b is stopped. Accordingly, the upper wafer $W_U$ falls down on the lower wafer $W_L$. The upper wafer $W_U$ gradually falls on the lower wafer $W_L$ to be in contact with each other, and the aforementioned bonding between the front surfaces $W_{U1}$ and $W_{L1}$ by the Van der Waals force and the hydrogen-bond is gradually expanded. Accordingly, the entire front surface $W_{U1}$ of the upper wafer $W_U$ and the entire front surface $W_{L1}$ of the lower wafer Mare brought into contact with each other, so that the upper wafer $W_U$ and the lower wafer $W_L$ are bonded (process S14 of FIG. 9).

In this process S14, since the rear surface $W_{U2}$ of the upper wafer $W_U$ is supported by the pins 191, the upper wafer $W_U$ is easily separated from the upper chuck 140 when the vacuum-exhaust of the upper wafer $W_U$ by the upper chuck 140 is released. Thus, the expansion (bonding wave) of the bonding between the upper wafer $W_U$ and the lower wafer $W_L$ takes place in a circular shape, so that the upper wafer $W_U$ and the lower wafer $W_L$ are appropriately bonded.

Thereafter, the actuator 211 of the pressing member 210 is raised up to the upper chuck 140. Further, by stopping the operation of the vacuum pumps 227a and 227b and thus stopping the vacuum-exhaust of the lower wafer $W_L$ in the suction region 224, the attracting and holding of the lower wafer $W_L$ by the lower chuck 141 is stopped. At this time, since the rear surface $W_{L2}$ of the lower wafer $W_L$ is supported by the pins 221, the lower wafer $W_L$ is easily separated from the lower chuck 141 when the vacuum-exhaust of the lower wafer $W_L$ by the lower chuck 141 is released.

Thereafter, the combined wafer $W_T$ obtained by the bonding of the upper wafer $W_U$ and the lower wafer $W_L$ is transferred to the transition device 51 by the wafer transfer device 61, and then is transferred into the cassette $C_T$ of the preset cassette placing table 11 by the wafer transfer device 22 of the carry-in/out station 2. Through these processes, the series of operations of the bonding processing for the wafers $W_U$ and $W_L$ is completed.

According to the exemplary embodiment as described above, by performing the hybrid control (servo control) using the laser interferometer system 170 and the linear scales 181 and 182 in the process S10, the positions of the lower chuck movers 162 and 165 in the horizontal direction can be appropriately adjusted. Further, even if the lower chuck 141 is deviated in the horizontal direction when it is moved in the vertical direction in the process S11, this deviation amount in the horizontal position can be measured by using the laser interferometer system 170 in the process S12. Then, by performing the hybrid control using the laser interferometer system 170 and the linear scales 181 and 182, the positions of the lower chuck movers 162 and 165 in the horizontal direction can be appropriately corrected. Accordingly, since the relative position between the upper chuck 140 and the lower chuck 141 can be appropriately adjusted, the bonding between the upper wafer $W_U$ held by the upper chuck 140 and the lower wafer $W_L$ held by the lower chuck 141 can be appropriately carried out later.

Moreover, since the bonding system 1 of the present exemplary embodiment is equipped with the surface modifying apparatus 30, the surface hydrophilizing apparatus 40 and the bonding apparatus 41, the bonding of the wafers $W_U$ and $W_L$ can be performed efficiently within the single system. Therefore, the throughput of the wafer bonding processing can be improved.

4. Other Exemplary Embodiments

Now, other exemplary embodiments of the present disclosure will be explained.

Figure 11:
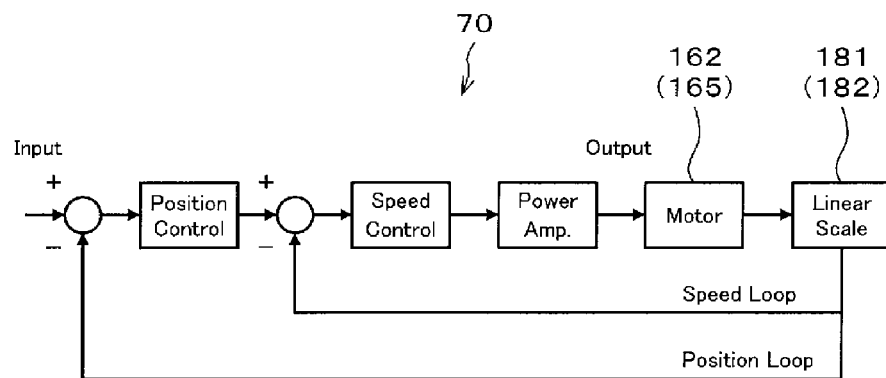
FIG. 11 is an explanatory diagram illustrating a configuration of a servo loop in a controller according to another exemplary embodiment.

In the above-described exemplary embodiment, though the servo loop shown in FIG. 7 is used in the servo-control over the first lower chuck mover 162 and the second lower chuck mover 165, the exemplary embodiment is not limited thereto. For example, the servo loop may have a position loop and a speed loop using the measurement results of the linear scales 181 and 182, as shown in FIG. 11.

In such a case, the position of the first lower chuck mover 162 in the X direction is measured by using the first linear scale 181, and the position of the second lower chuck mover 165 in the Y direction is measured by using the second linear scale 182. Then, the lower chuck movers 162 and 165 are servo-controlled by using the position loop and the speed loop using the measurement results of the linear scales 181 and 182.

Thereafter, the position of the lower chuck 141 in the X direction is measured by using the first laser interferometer 176, and the position of the lower chuck 141 in the Y direction is measured by using the second laser interferometer 177. Further, a correction amount for the position of the first lower chuck mover 162 in the X direction and a correction amount for the position of the second lower chuck mover 165 in the Y direction are calculated from the measurement results of the laser interferometer system 170. Then, the lower chuck movers 162 and 165 are servo-controlled based on these correction amounts.

In the present exemplary embodiment, the same effects as obtained in the above-described exemplary embodiment can be achieved. That is, the relative position between the upper chuck 140 and the lower chuck 141 can be appropriately adjusted, and the bonding between the upper wafer $W_U$ held by the upper chuck 140 and the lower wafer $W_L$ held by the lower chuck 141 can be appropriately carried out later.

Further, in the present exemplary embodiment, the servo-control over the lower chuck movers 162 and 165 is performed by using only the measurement results of the linear scales 181 and 182, and by increasing a gain, the responsiveness can be bettered.

In the present exemplary embodiment, after the lower chuck movers 162 and 165 are servo-controlled by using the measurement results of the linear scales 181 and 182, the lower chuck movers 162 and 165 are further servo-controlled by using the measurement results of the laser interferometer system 170. In the above-described exemplary embodiment, however, the lower chuck movers 162 and 165 are hybrid-controlled by using the measurement results of the laser interferometer system 170 and the measurement results of the linear scales 181 and 182. As a result, the throughput of the wafer bonding processing can be improved.

Moreover, though the lower chuck 141 is configured to be movable in the horizontal direction in the bonding apparatus 41 according to the above-described exemplary embodiment, the upper chuck 140 may be configured to be movable in the horizontal direction instead. In such a case, the laser interferometer system 170 and the linear scales 181 and 182 may be provided at the upper chuck 140. Alternatively, both the upper chuck 140 and the lower chuck 141 may be configured to be horizontally movable. In such a configuration, the laser interferometer system 170 and the linear scales 181 and 182 may be provided at one of the upper chuck 140 or the lower chuck 141.

Further, though the lower chuck 141 is configured to be movable in the vertical direction in the bonding apparatus 41 according to the above-described exemplary embodiment, the upper chuck 140 may be configured to be vertically movable instead, or both the upper chuck 140 and the lower chuck 141 may be configured to be vertically movable.

In addition, though the lower chuck 141 is configured to be rotatable in the bonding apparatus 41 according to the above-described exemplary embodiment, the upper chuck 140 may be configured to be rotatable instead, or both the upper chuck 140 and the lower chuck 141 may be configured to be rotatable.

In addition, in the bonding system 1 according to the above-stated exemplary embodiment, after the wafers $W_U$ and the $W_L$ are bonded in the bonding apparatus 41, the obtained combined wafer $W_T$ may be heated to a preset temperature (annealing processing). By performing this heating processing on the combined wafer $W_T$, bonding interfaces can be firmly bonded.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept. In the present disclosure, the substrate is not limited to the wafer. The present disclosure is also applicable to various other types of substrates such as a FPD (Flat Panel Display), a mask reticle for photomask, and so forth.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

1: Bonding system
   2: Carry-in/out station
   3: Processing station
   30: Surface modifying apparatus
   40: Surface hydrophilizing apparatus
   41: Bonding apparatus
   61: Wafer transfer device
   70: Controller
   140: Upper chuck
   141: Lower chuck
   162: First lower chuck mover
   165: Second lower chuck mover
   170: Laser interferometer system
   174: First reflection plate
   175: Second reflection plate
   176: First laser interferometer system
   177: Second laser interferometer system
   181: First linear scale
   182: Second linear scale
   $W_U$: Upper wafer
   $W_L$: Lower wafer
   $W_T$: Combined wafer

We claim:

1. A bonding apparatus configured to bond substrates, comprising:
   a first holder configured to vacuum-exhaust a first substrate to attract and hold the first substrate on a bottom surface thereof;

a second holder disposed under the first holder, and configured to vacuum-exhaust a second substrate to attract and hold the second substrate on a top surface thereof;

a first mover configured to move the first holder and the second holder relatively in a horizontal direction;

a laser interferometer system configured to measure a position of the first holder or the second holder which is moved by the first mover;

a linear scale configured to measure a position of the first mover;

a second mover configured to move the first holder and the second holder relatively in a vertical direction; and a controller configured to:

control the second mover to adjust a position between the first holder and the second holder in the vertical direction;

control the first mover to adjust a position between the first holder and the second holder in the horizontal direction based on a measurement result of the laser interferometer system and a measurement result of the liner scale; and then, start a bonding between a center of the first substrate and a center of the second substrate which are pressed against each other, thereby gradually expanding the bonding, wherein the controller is configured to calculate a correction amount for a position of the first mover in the horizontal direction, and control the first mover based on the correction amount.

2. The bonding apparatus of claim 1, wherein the controller is configured to control the first mover to adjust a horizontal position between the first holder and the second holder in the horizontal direction before controlling the second mover to adjust a position between the first holder and the second holder in the vertical direction.

3. The bonding apparatus of claim 1, wherein a reflection plate is provided at a position of the first holder or the second holder, which is moved by the first mover, to face the laser interferometer system.

4. The bonding apparatus of claim 3, wherein a length of the reflection plate in the horizontal direction is equal to or larger than a moving distance of the first holder or the second holder, which is moved by the first mover in the horizontal direction, and a length of the reflection plate in a vertical direction is equal to or larger than a moving distance of the first holder or the second holder, which is moved in the vertical direction.

5. The bonding apparatus of claim 2, wherein the controller includes, as a servo loop controlling the first mover, a position loop in which a position of the first mover is feedback-controlled and a speed loop in which a speed of the first mover is feedback controlled, and the measurement result of the linear scale is used at least in the speed loop among the position loop and the speed loop.

6. A bonding system equipped with a bonding apparatus configured to bond substrates, wherein the bonding apparatus comprises:

a first holder configured to vacuum-exhaust a first substrate to attract and hold the first substrate on a bottom surface thereof;

a second holder disposed under the first holder, and configured to vacuum-exhaust a second substrate to attract and hold the second substrate on a top surface thereof;

a first mover configured to move the first holder and the second holder relatively in a horizontal direction;

a laser interferometer system configured to measure a position of the first holder or the second holder which is moved by the first mover;

a linear scale configured to measure a position of the first mover;

a second mover configured to move the first holder and the second holder relatively in a vertical direction; and a controller configured to:

control the second mover to adjust a position between the first holder and the second holder in the vertical direction;

control the first mover to adjust a position between the first holder and the second holder in the horizontal direction based on a measurement result of the laser interferometer system and a measurement result of the liner scale; and then, start a bonding between a center of the first substrate and a center of the second substrate which are pressed against each other, thereby gradually expanding the bonding, wherein the controller is configured to calculate a correction amount for a position of the first mover in the horizontal direction, and control the first mover based on the correction amount, wherein the bonding system comprises:

a processing station equipped with the bonding apparatus; and a carry-in/out station configured to place thereon multiple first substrates, multiple second substrates or multiple combined substrates each obtained by bonding the first substrate and the second substrate, and configured to carry the first substrates, the second substrates or the combined substrates into/from the processing station, wherein the processing station comprises:

a surface modifying apparatus configured to modify surfaces of the first substrate or the second substrate to be bonded;

a surface hydrophilizing apparatus configured to hydrophilize the surfaces of the first substrate or the second substrate modified by the surface modifying apparatus; and a transfer device configured to transfer the first substrates, the second substrates or the combined substrates with respect to the surface modifying apparatus, the surface hydrophilizing apparatus and the bonding apparatus, and wherein, in the bonding apparatus, the first substrate and the second substrate having the surfaces hydrophilized by the surface hydrophilizing apparatus are bonded.

7. A bonding method of bonding substrates by using a bonding apparatus, wherein the bonding apparatus comprises:

a first holder configured to vacuum-exhaust a first substrate to attract and hold the first substrate on a bottom surface thereof;

a second holder disposed under the first holder, and configured to vacuum-exhaust a second substrate to attract and hold the second substrate on a top surface thereof;

a first mover configured to move the first holder and the second holder relatively in a horizontal direction;

a laser interferometer system configured to measure a position of the first holder or the second holder which is moved by the first mover, a linear scale configured to measure a position of the first mover, and a second mover configured to move the first holder and the second holder relatively in a vertical direction; and wherein the bonding method comprises:

controlling the first mover to adjust a horizontal position between the first holder and the second holder in the horizontal direction;

then, controlling the second mover to adjust a position between the first holder and the second holder in the vertical direction;

then, calculating a correction amount for a position of the first mover in the horizontal direction;

then, controlling the first mover to adjust a position between the first holder and the second holder in the horizontal direction based on a measurement result of the laser interferometer system, a measurement result of the liner scale and the correction amount; and then, starting a bonding between a center of the first substrate and a center of the second substrate which are pressed against each other, and expanding the bonding to be gradually expanded.

8. A computer-readable recording medium having stored thereon computer-executable instructions that, in response to execution, cause a bonding apparatus to perform a bonding method, wherein the bonding apparatus comprises:

a first holder configured to vacuum-exhaust a first substrate to attract and hold the first substrate on a bottom surface thereof, a second holder disposed under the first holder, and configured to vacuum-exhaust a second substrate to attract and hold the second substrate on a top surface thereof;

a first mover configured to move the first holder and the second holder relatively in a horizontal direction;

a laser interferometer system configured to measure a position of the first holder or the second holder moved by the first mover, a linear scale configured to measure a position of the first mover, and a second mover configured to move the first holder and the second holder relatively in a vertical direction; and wherein the bonding method comprises:

controlling the first mover to adjust a horizontal position between the first holder and the second holder in the horizontal direction;

then, controlling the second mover to adjust a position between the first holder and the second holder in the vertical direction;

then, calculating a correction amount for a position of the first mover in the horizontal direction;

then, controlling the first mover to adjust a position between the first holder and the second holder in the horizontal direction based on a measurement result of the laser interferometer system, a measurement result of the liner scale and the correction amount; and then, starting a bonding between a center of the first substrate and a center of the second substrate which are pressed against each other, and expanding the bonding to be gradually expanded.

* * * * *